United States Patent [19]

Jeppesen, III et al.

[11] Patent Number: 5,708,773

[45] Date of Patent: Jan. 13, 1998

[54] JTAG INTERFACE SYSTEM FOR COMMUNICATING WITH COMPLIANT AND NON-COMPLIANT JTAG DEVICES

[75] Inventors: James Henry Jeppesen, III, Lake Forest; Kelly Sue St. Clair-Hong, Rancho Santa Margarita, both of Calif.

[73] Assignee: Unisys Corporation, Blue Bell, Pa.

[21] Appl. No.: 504,975

[22] Filed: Jul. 20, 1995

[51] Int. Cl.[6] .................................................... G06F 11/00
[52] U.S. Cl. ............................... 395/183.06; 371/22.3
[58] Field of Search ............................... 371/22.1, 22.3, 371/22.5, 22.6, 25.1, 27; 395/183.06, 500, 183.07; 324/73 R, 158 R

[56] References Cited

U.S. PATENT DOCUMENTS

| | | | |
|---|---|---|---|
| 5,329,471 | 7/1994 | Swoboda et al. | 364/578 |
| 5,574,730 | 11/1996 | End, III et al. | 395/290 |
| 5,581,541 | 12/1996 | Whersel | 370/241 |
| 5,621,651 | 4/1997 | Whersel | 370/402 |
| 5,627,842 | 5/1997 | Brown et al. | 371/22.3 |

*Primary Examiner*—Vincent P. Canney
*Attorney, Agent, or Firm*—Alfred W. Kozak; Mark T. Starr; Steven R. Petersen

[57] ABSTRACT

A system and method for using standard JTAG protocol for testing protocol compliant and non-protocol compliant digital devices without altering the JTAG protocol or the non-compliant device. A specialized Test Access Port Controller controls and monitors the states applied to the non-compliant device in order to eliminate the PAUSE state in the non-compliant device and to limit the Run-Test/Idle state to one clock period.

8 Claims, 13 Drawing Sheets

SPECIALIZED TAP
BLOCK DIAGRAM

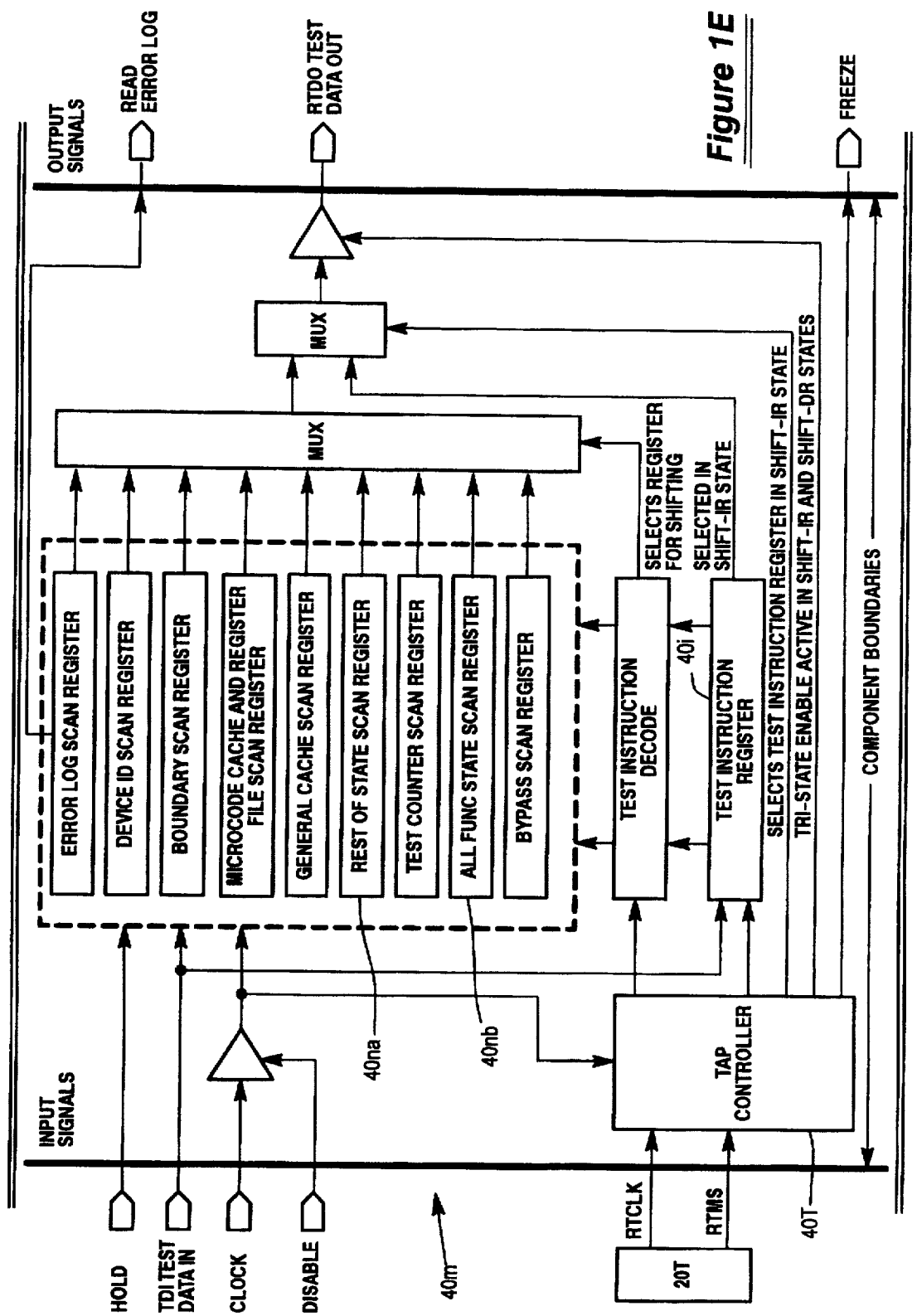

JTAG INTERFACE SYSTEM FOR COMMUNICATING WITH COMPLIANT AND NON-COMPLIANT JTAG DEVICES

FIELD OF THE INVENTION

The present disclosure refers to systems which have JTAG compliant circuitry and non-JTAG complaint circuitry with the purpose of permitting JTAG testing functionality for both the compliant device circuitry and the non-compliant device circuitry.

BACKGROUND OF THE INVENTION

The acronym JTAG is designation given to an interface which is defined by the IEEE 1149.1 standard for testing of electronic circuitry. This acronym originally came from a committee group which was designated as the joint test access group (JTAG) which defined the IEEE standard. The IEEE standard 1149.1 is used for a wide variety of test functions, including testing "internal chip" functions and for testing the chip interconnects on a printed circuit board. The JTAG system also allows for access to chip-level built-in self test at the board level by providing a way to load all of the input pins with data without having to control the particular chips which are sourcing those inputs. Thus, the normal input sources can be momentarily disconnected from the circuitry and an internal set of flip-flops can be inserted for testing and diagnostic purposes.

The function of a JTAG device and its circuitry is determined by the state of the Test Access Port (TAP) Controller. This controller operates through a series of different state conditions which are shown in FIGS. 3 and FIG. 4. Instructions placed in the Instruction Register (IR) will operate to select a given test mode or register accessed through the Data Register (DR).

A value in the Instruction Register (IR) determines which particular shift chain is to be selected to shift out during the state designated as the Shift-DR state. The value of the Instruction Register also determines the function of the chip in other designated states, such as Capture-DR and also Update-DR (DR=Data Register).

The Test Access Port or "TAP" is a state machine which operates to set up different state conditions which provide various different functions. The combination of the Instruction Register (IR) and TAP state machine (FIGS. 3 and 4) will determine the behavior of the device for each clock period.

For operational functions, the TAP state machine is put into the state designated as Run-Test-Idle and the Instruction Register is loaded with an instruction designated as the "BYPASS" instruction. This BYPASS instruction selects a bypass register for shifting out data, and allows for the normal functional operation in all of the states of the TAP controller $10_c$ shown in FIGS. 1A, 1B or controller 7 in FIG. 9.

The JTAG system is used for initialization and reading out error states of a given set of circuitry, such as an integrated circuit device. The initial data is shifted into various chips, such as integrated circuit chips, before the chip is run. RAMs can be written quickly by shifting in a shorter function-specific shift chain with the address and data and then emitting one functional clock.

Error registers are read out, through shifting, when an error is indicated by the controller block $10_c$. At the printed circuit board level, the JTAG system is used for initialization to set up the original circuitry conditions, as well as for chip interconnect testing.

With the extremely high rate of production and use of integrated circuits and computers and in other types of digital module operations, designers have been increasingly aware that methods for testing and diagnosing the internal structure and operation of integrated chips is a necessary and important function. The desirability of initiating standards for embedding logic circuitry into integrated chips has been proposed and developed by the IEEE committees which have proposed a boundary scan architecture designated IEEE 1149.1. This boundary scan architecture involves placing a chain of registers around the periphery of an integrated circuit in order to allow the device's input/output (I/O) to be controlled and observed by means of a four-wire serial scan bus. Thus, the registers for multiple devices can be connected in series to form a complete path through all of the devices either completely within the integrated circuit chip or can also be used for providing a serial path scan on an entire board holding integrated circuit devices.

The IEEE 1149.1 standards define operations for allowing a sampling of boundary values during "normal operation" in order to observe data flow and further allow the selection of a scan bypass register to provide a single-bit scan path through a device. Thus, as seen in the attached FIG. 9, the IEEE standard provides an integrated circuit (IC) level test framework consisting of a four-wire Test Access Port (TAP) controller 7 and the rest of the related scan path architecture shown in FIG. 9.

The Test Access Port (TAP) controller 7 (FIG. 9) receives external control signals by means of a Test Clock (TCK) on line $7_k$ and also a Test Mode Select (TMS) signal on line $7_m$. It then provides output control signals to the internal scanned pathways.

Absent the requirement for embedded testability, the normal integrated circuit logic would be represented in FIG. 9, by the block 8 where data could be fed in on line $6_i$ and routed out on line $6_o$.

However, by adding in the auxiliary embedded logic into the chip, it is then possible to provide "testability" of the chip for integrity in addition to being able to read out the various state conditions of each of the logic circuits in the integrated circuit logic unit 8.

As seen in FIG. 9, the scan path architecture will be seen to have a single serial instruction register (IR) 10 and serial data registers such as 15a and 15b. Data Registers (DR) 15a and 15b are designated as Boundary Scan Registers 15 (BSCAN). As seen in FIG. 9, the data register 16 is the BYPASS register.

The Instruction Register 10 (IR) the Bypass Register 16, and the Boundary Scan Registers 15 are connected in parallel between a serial TDI (Test Data Input) signal line 5 and a serial TDO (Test Data Output) signal on line 25.

The TDI input line 5 in FIG. 9 is connected directly to the serial inputs of the Instruction Register (IR) 10, Bypass Register 16 and the Boundary Scan registers 15. The Test Data Output on line 25 (TDO) can receive its signals from several sources, namely: from the Instruction Register (IR) 10, from the BYPASS Register 16 via multiplexer $22_x$ and multiplexer $21_x$, or the Test Data Output line (TDO) line 25 may receive data from the Boundary Scan Register 15b through the multiplexer $22_x$ and the multiplexer $21_x$.

The selective control signals for the multiplexer $21_x$ is supplied by the TAP (Test Access Port) controller 7. The selection control signals for the multiplexer $22_x$ comes from the Instruction Register 10.

When "boundary testing" is not being performed, the Boundary Scan registers 15a and 15b are "transparent" and out of the circuit, thus allowing the input signals $6_i$ and the output signals $6_o$ to pass into and out of the integrated circuit (IC) logic 8.

However, during "boundary testing" in FIG. 9, the Boundary Scan registers 15a and 15b will disable the normal flow of data between the input $6_i$ and the output $6_o$ in order to allow boundary signals of the integrated circuit (IC) 8, to be controlled and observed by means of scanning operations.

Thus, there is provided the ability to sample data passing through the I/O boundary of an integrated circuit or groups of integrated circuits thus allowing the designers to take a snapshot of the logic states within the integrated circuit or within the group of integrated circuits on a printed circuit board without removing the board from its container.

The concept involved here is often called built-in testability (BIT). Thus, by providing the greater control and observability of the internal nodes in the normal logic 8, this allows a system to be tested much more efficiently with smaller test programs, shorter execution times and greater fault coverage. This type of efficiency can reduce the time and expense on "test generation" during the verification process or the de-bug process, thus allowing a more rapid and more reliable testing situation.

In addition to checking the hardware circuitry, the enhanced accessibility of the "states" of the internal nodes of the integrated circuit can simplify application software testing and hardware/software integration. Thus, software designers can use the test bus 5 (TDI) in FIG. 9 in order to download code for the purpose of targeting various elements in the integrated circuit hardware and to monitor their response. With this increased level of observability, this makes it easier to sort out the hardware/software from types of integration problems.

Thus, while many earlier systems required debug and testing to occur by means of pulling out suspected printed circuit boards or pulling out suspected integrated circuit chips out of the system and putting in new ones in order to correct system problems in the field, however, in the presently described testing system, the maintenance can be carried out internally and diagnostically, thus eliminating the necessity for carrying spare boards or integrated circuit chips which would be used for replacing defective boards and defective chips.

The designation JTAG refers to an architecture proposed by the IEEE Joint Test Action Group (JTAG), which specifies a four-wire test bus and a Boundary Scan architecture for embedding around the logic circuitry of an integrated circuit chip (IC). This enables the linking of integrated circuit logic for the enablement of testing and diagnosis. Thus, these type of built-in test features which have been specified in IEEE Standard 1149.1, now provide many advantages in testing and debugging integrated circuit chips in computer modules.

As was seen in FIG. 9, the JTAG interface consists of four signals. These are the Test Mode Select signal on line $7_m$ (TMS), the Test Clock signal on line $7_k$ (TCK), the Test Data In signal on line 5 (TDI) and the Test Data Out signal on line 25 (TDO).

TMS is the signal which is used to determine the next "state condition" of the TAP controller state machine $10_e$ in FIGS. 1A,B and 2A,B. The TAP controller state machine, $10_e$, is often designated as the TBC (or Test Bus Controller). TCK is the clock signal which affects both the TAP controller $10_e$ and the Boundary Scan registers 15a and 15b of FIG. 9. The rising edge of the TCK signal combined with the value of the Test Mode Select (TMS) signal and the current "value" of the TAP state machine $10_e$ will determine the "next value" of the state machine $10_e$. The TDI and TDO signals are the beginning and ending of a series of shift chains which are used to capture information in the integrated circuit logic 8 and feed it out to a maintenance system 60 for diagnostics.

The concept of a compliant circuitry device in regard to the IEEE 1149.1 standards indicates that the device circuitry is compatible for operation with the JTAG operations. In order to be a compliant device, all of the essential specifications of the IEEE standard specifications must be met. The true test of a "compliant" circuit device is whether or not the device can communicate with another "also compliant" circuitry device. The compliant-type device is designed to expect its communications to be of a certain particular format for timing arrangement. Compliance to the IEEE specifications guarantees that the produced circuitry device is able to match the IEEE specification operations.

NON-COMPLIANT CIRCUITRY DEVICES: A non-compliant circuitry device (NCD) is one that does not meet each one of the total set of specification requirements of IEEE 1149.1. The situation of a non-compliant circuitry device is not always a problem, because occasionally the issue of non-compliance is a trivial one and does not affect the necessary communication between the devices. However, and more often, there are different expectations in the circuitry devices that are serious enough so that the devices cannot work together in a easy straightforward manner. When this occurs, the circuitry devices can end up in different TAP states (FIGS. 3,4) than what is expected by the specifications, or else the circuitry device can continue "running" when it was expected to be in a "holding" operation. Thus basically, the non-compliant circuitry device just does not do what the other compliant devices are expecting it to do.

Microprocessors, which were developed before the issuance of the JTAG system protocol was totally standardized, were used on processor boards for mainframe computers. Such type of microprocessors had many of the JTAG elements in it, but generally were not fully compliant with the JTAG system. However, when a processor board was designed using a standard JTAG controller, the expectation involved was that all the devices which were connected to the JTAG controller would be compliant with the IEEE standards.

As an example of a non-compliant device, FIG. 1D shows a portion of the elements in a microprocessor integrated circuit chip.

Here, the test data input TDI passes through a set of control registers into an input address and data register unit. From these registers, it is possible to exercise the general cache RAM of the microprocessor so that data from the exercise is passed into the output address registers. Then, the test data input forms a snake through the input address register and out through the output address register in a series of bits which are carried out of the integrated circuit chip on the TDO test data output line. The control registers input address and data register and the output address registers are designated herein as scan registers.

The general cache scan registers contain the logic registers which are required to read from or write into the general cache RAM. The general cache RAM is an illustration of only one of the logic elements which can be tested and scanned. FIG. 1E shows a more expanded diagram in generalized form which indicates other typical logical circuitry which can be scanned.

For example, in FIG. 1E the microprocessor IC chip can also have other registers such as the error log scan register, the boundary scan register, the microcode cache and file scan register, the general cache scan register, etc. as seen in FIG. 1E.

In FIG. 1E, the test access port TAP controller 40T working from input control signals operates to set up various states of operation for the multiple numbers of scan registers seen in FIG. 1E. Test data in or TDI signals are seen coming in on the left-hand side of the scan registers and output to the right-hand side to a multiplexer wherein at various times certain ones of these scan registers can be selected for output to the test data output line, RTDO.

As will be described hereinafter, two specific scan registers which pass test data through them in 16-bit groups are found to lead to certain types of problems. These two problem areas are discussed below.

In FIG. 1E, the test instruction register $40_i$ is selected via JTAG protocol in the Shift-IR state. Then, the test instruction decode unit selects the particular register for shifting.

The TAP controller 40T also selects the test instruction register for putting it into the Shift-IR state.

In FIG. 1E, the microprocessor IC chip has two registers which are problem areas since they do not function compatibly with the JTAG protocol. These are indicated in FIG. 1E as scan registers $40_{na}$ and $40_{nb}$. These scan registers in the microprocessor chip caused the chip to function as a non-compatible device.

The scan register $40_{na}$ functions to catch all test data bits which are not handled by the specific scan registers, while scan register $40_{nb}$ is a collector of all the test bits from each one of the multiple scan registers. The TAP controller 40T is a standard JTAG controller but is controlled by the specialized TAP 20T to modify its operation as described below. The TAP controller 40T never goes to the PAUSE state and functions as if it is in the SHIFT state under control of the specialized TAP 20T.

There were two areas where such non-compliant microprocessor devices were non-compliant.

(a) The first area of non-compliancy involved the behavior of the chip in the Pause-DR state. This state will be seen in FIGS. 3 and 4 as one of the state conditions of the JTAG state machine $10_c$. When shifting in data into the chip, the controller $10_c$ should be able to put the receiving device, (in this case, the microprocessor chip,) into a "hold state" while it is accessing the next data block to be shifted in. The "Pause-DR" state allows the controller $10_c$ to accomplish this. The Pause-DR state can be entered from the "Shift DR" state and the controller $10_c$ can loop in that state for multiple clocks until it is ready to resume shifting or to exit the shift sequence.

In the Pause-DR state, all of the logic in the circuitry device undergoing testing must remain the same. However, in the microprocessor chip under observation, there was one flip-flop that did not hold in the "Pause-DR" state. When the controller $10_c$ shifted data into or out of certain scan registers of the microprocessor chip, it did so in 16-bit segments, because of the size of the internal shift register in the JTAG Controller $10_c$. The controller $10_c$ would then put the circuitry device into the state of "Pause-DR" while it fetched the next 16-bit segment of data.

During this time, the "erroneous bit" would load, corrupting the shift chain every 16th bit.

The 16-bit shift register of controller $10_c$ provides an input TDI to the boundary scan register which includes a single bit register designated as the "erroneous bit." The boundary scan register provides a test data output signal TDO. As the boundary scan register shifts from left to right, it pauses every 16 bits. When it pauses, the erroneous bit does not hold but instead, loads a value of "1." However, if the value that the erroneous bit register was holding was equal to "0," it means that that bit is now corrupted due to becoming a logic "1."

This happens very 16 bits since the JTAG controller pauses at that point to wait for more scan data. All values of the scan chain to the left of the erroneous "bad bit" bit must pass through that bit register on the way to the Test Data Output. However, anytime that this shifting is occurring and then the "Pause" state is entered, that particular bit can be "corrupted" since it does not hold its expected state. A problem arises with the single bit designed as the "erroneous bit." During the shift state transitioning to the Pause state, the erroneous bit should stay at its current logic value. However, the erroneous bit, instead, will always set its current logic value to "logic 1." Thus, during the "Pause" state, when the expectation is for the erroneous bit to stay at "logic 0," it flips to a "logic 1" and disrupts the proper sequence of operation.

(b) The second problem which would occur, involved the behavior of the device in the Run-Test-Idle state seen in FIGS. 3 and 4. The Run-Test-Idle state is used to issue a single functional clock and then sit and wait until that state is changed. The microprocessor chip involved was designed to issue the functional clock on every rising edge of the signal TCK on line $7_k$ while the TAP was in the Run Test/Idle State. In essence, the functional clock was considered to be a new clock in Run-Test-Idle even if the controller $10_c$ was just looping within that state. (In FIG. 4 there is seen an external looping arrow which indicates the loop operation situation.) Thus, it was possible to loop in the Run-Test-Idle state and to continue issuing multiple-function clock signals which is a useful and simpler operation during RAM writes. The RAM (FIG. 1D) herein is part of the non-compliant microprocessor module. The looping of the Run-Test-Idle state and issuance of multiple-function clocks caused considerable problems with the JTAG controller $10_c$ because it expected the microprocessor undergoing test to be "holding" while in that state. However, the microprocessor device does not hold but instead begins executing functional clocks. In this situation, the microprocessor undergoing tests was found to be running functional clocks which caused the values in the internal registers and the RAMs to be different from what the system had set it up to be and what the system still expected it to be.

Thus, the microprocessor under test no longer contained the data in its internal RAM that the controller $10_c$ expected it to contain at the state of execution.

The "initial state" is the state that the system puts the microprocessor device in, when it first starts a task. It is the "starting state" before any operations can be performed.

The presently described JTAG interface which provides compatibility and useability for both compliant and non-compliant devices will be seen to provide methods of handling the type of problems just considered.

SUMMARY OF THE INVENTION

In a digital system environment, there is generally one or more printed circuit boards which have digital circuitry, some of which is compatible with the JTAG protocol testing system and other which are not compatible (non-compliant) with the JTAG testing protocol and environment. A necessary function in such digital systems is the provision of maintenance modules which are used to interface these devices and to test the devices while still mounted in their printed circuit boards.

If a given device does not conform to the industry standard interface, such as the JTAG IEEE 1149.1 system protocol interface, then the designer must develop a specialized proprietary interface and then develop tests special to that interface. This, of course, is a burden in time, expense, money and effort in order to develop and debug the maintenance interface instead of the system hardware.

In this situation, the complexity of the maintenance logic is increased which has unfortunate effects on the board space available for system hardware.

The presently developed specialized test access port designated STAP has been provided to eliminate these problems by intercepting the industry standard interface in order to control the "non-compliant" devices in a fashion where these non-compliant devices would appear to conform with the standard protocol interfaces.

By utilizing the specialized Test Access Port design (STAP), the industry software was now able to control a non-compliant device without modification to the non-compliant device. Thus, the testing procedures developed through the industry standard software could now be used on cards during power-up and by the regular factory test equipment. As a result of this, there was a reduced effort required to support the manufacturing and engineering overhead of the test functions. Additionally, the maintenance logic was minimized, thus allowing for maximum board space to be available for system logic.

BRIEF DESCRIPTION OF THE DRAWINGS

FIG. 1E is an expanded diagram of the microprocessor chip showing a TAP controller and multiple scan registers for taking in test data for output to another device;

FIGS. 5, 6, 7 and 8 show the waveforms generated by the specialized test access port;

FIG. 5 shows a path which selects the Instruction Register of the device in order to begin shifting operations;

FIG. 6 shows the instruction register shift which first transitions into the Pause-IR state before data is actually shifted into the IR register;

FIGS. 7 and 8 show the DR Register shifting results;

DESCRIPTION OF PREFERRED EMBODIMENT

Figure 2A:
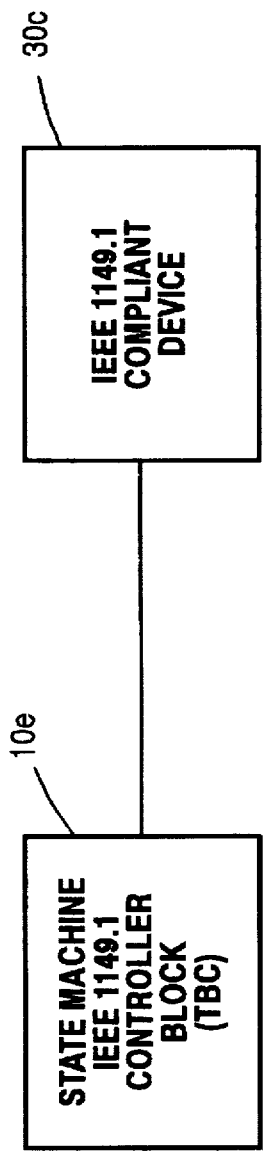
FIG. 2A is a block diagram showing connections for a standard IEEE 1149.1 compatible device.
Figure 2B:
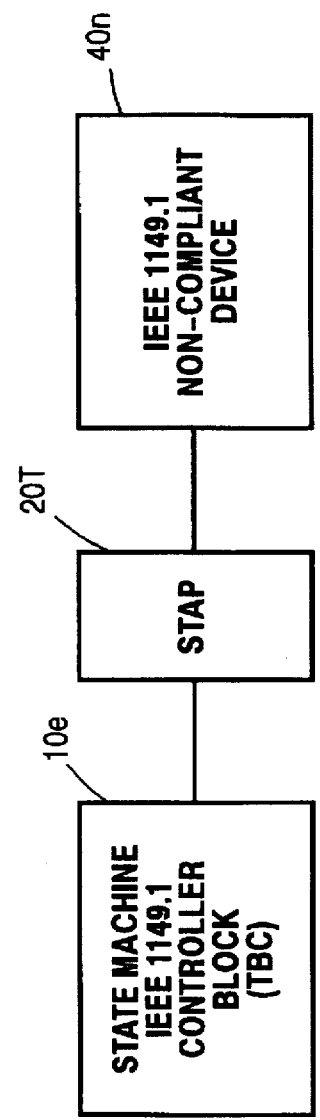
FIG. 2B is a block diagram showing the use of a specialized test access port (STAP) for providing connection to a non-compliant circuitry device.
Figure 9:
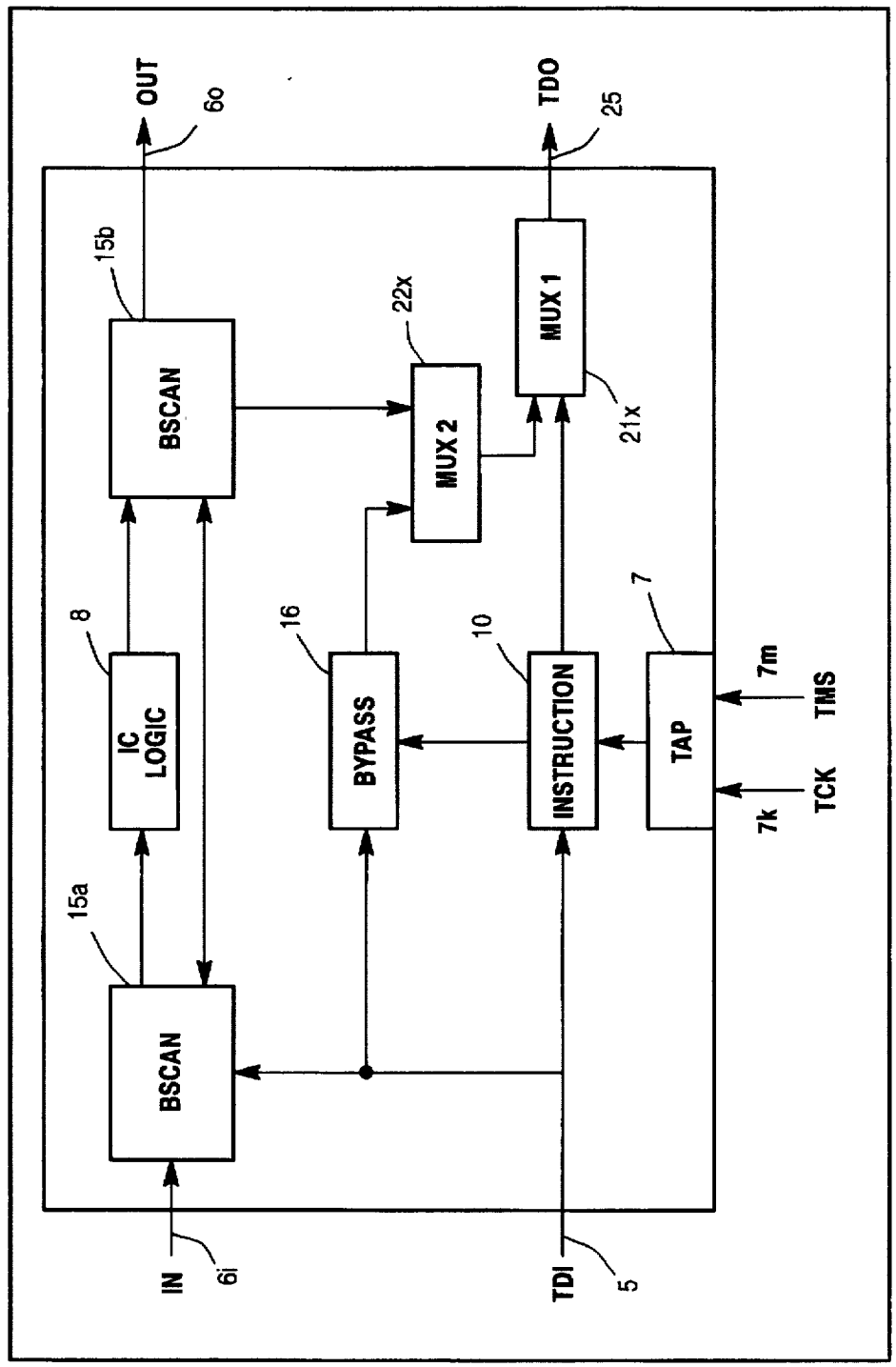
FIG. 9 is a diagram showing how the Boundary Scan features of the JTAG system within a standard compliant device, is used to test and diagnose integrated circuit logic.

FIG. 2A indicates a typical block diagram showing how a JTAG compliant circuitry device $30_c$ is connected to the TAP controller block state machine $10_e$. The state machine $10_e$ would correspond to the Test Access Port controller 7 of FIG. 9. The device $30_c$ which is the compliant circuitry device will use functional protocol which follows the Test Access Port diagram shown in FIG. 3. However, since a "non-compliant" circuitry device cannot use the Pause-DR and the Pause-IR states, or receive more than one clock in the "Run-Test/Idle" state, a specialized block designated STAP, 20T, is inserted between the controller chip $10_e$ (TBC, Test Base Controller) and the non-compliant circuitry device $40_n$ which is seen in FIG. 2B.

Figure 3:
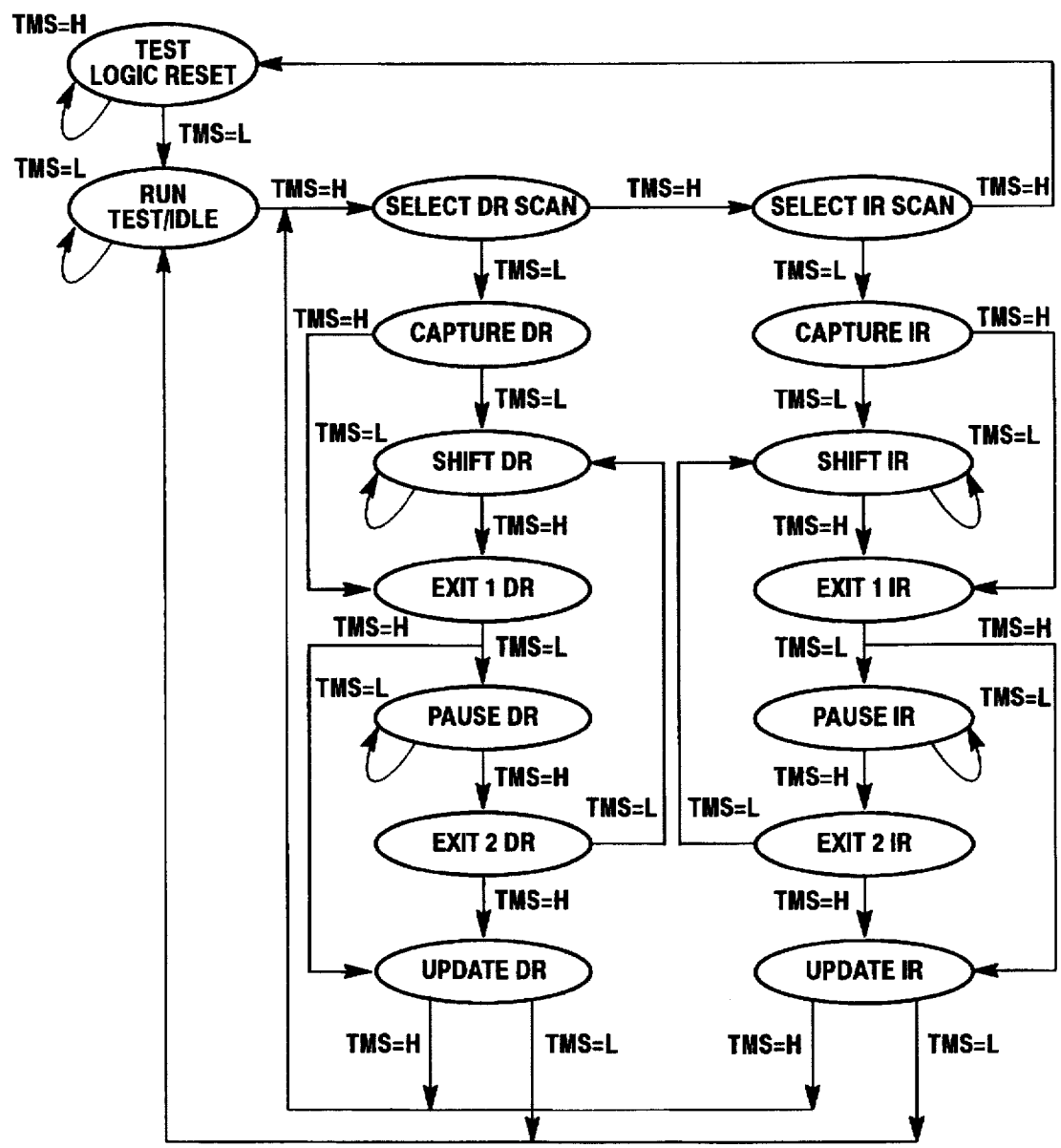
FIG. 3 shows a standard controller state machine diagram that is normally used.

The function of the specialized Test Access Port unit 20T, RASTAP, is to control the non-compliant circuitry device $40_n$ the same way that the IEEE 1149.1 controller chip $10_e$ would do without causing the non-compliant device Test Access Port 20T to enter either one of the "Pause" states and further to insure that only one clock (TCLK) is issued when the non-compliant device TAP (STAP 20T) enters the Run-Test/Idle state seen in FIG. 3.

Figure 1A:
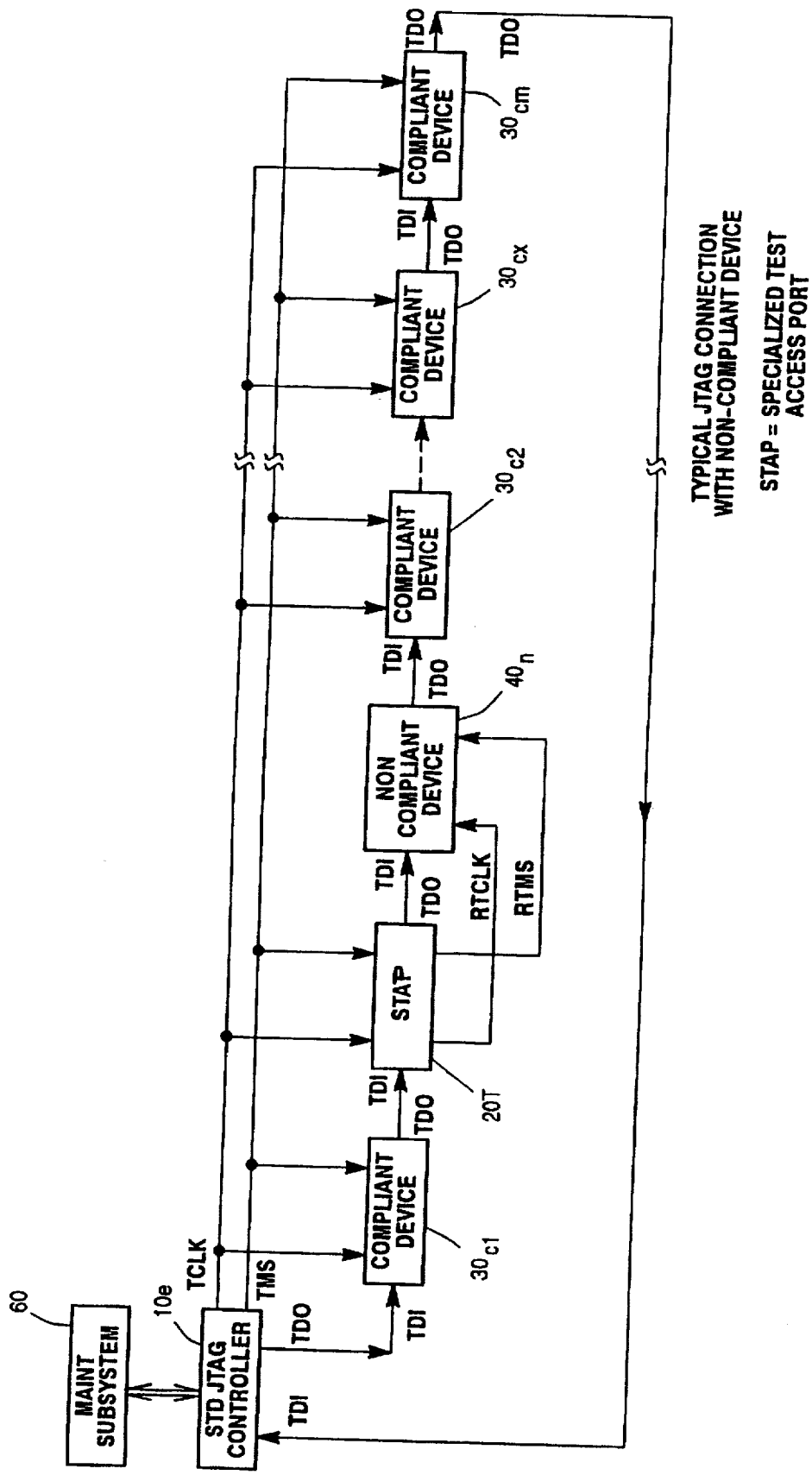
FIG. 1A is a circuit block diagram showing a digital system having devices compliant with the JTAG standard protocol and devices which are not compliant with this protocol.

FIG. 1A illustrates a digital system which can be tested under the control of a maintenance subsystem 60, using the standard IEEE 1149.1 protocol even through there are devices which are not compliant to the standard JTAG protocol. As seen in FIG. 1A, a standard JTAG controller $10_e$ (which also sometimes designed as a Test Bus Controller or TBC) provides a Test Data Output TDO line to a series of digital modules in a system. Part of the output of the TBC $10_e$ is the clock signal designated TCLK and the test mode select signal TMS. These signals are applicable to the state diagram shown in FIGS. 3 and 4.

In FIG. 1A, the digital system is seen to be composed of compliant devices, that is to say, JTAG protocol compliant devices seen as $30_{c1}$, $30_{c2}$, ... $30_{cx}$ ... $30_{cn}$. Additionally, it will be seen that the system may also have non-compliant devices, designed $40_n$ which are not compatible with JTAG protocol. In this case, it will be seen that a specialized test access port 20T designated RASTAP has been inserted onto the TCLK and the TMS lines in order to provide specialized clock outputs and test mode select outputs respectively designated as RTCLK and RTMS for input to the non-compliant device $40_n$, FIG. 1A.

Figure 1B:
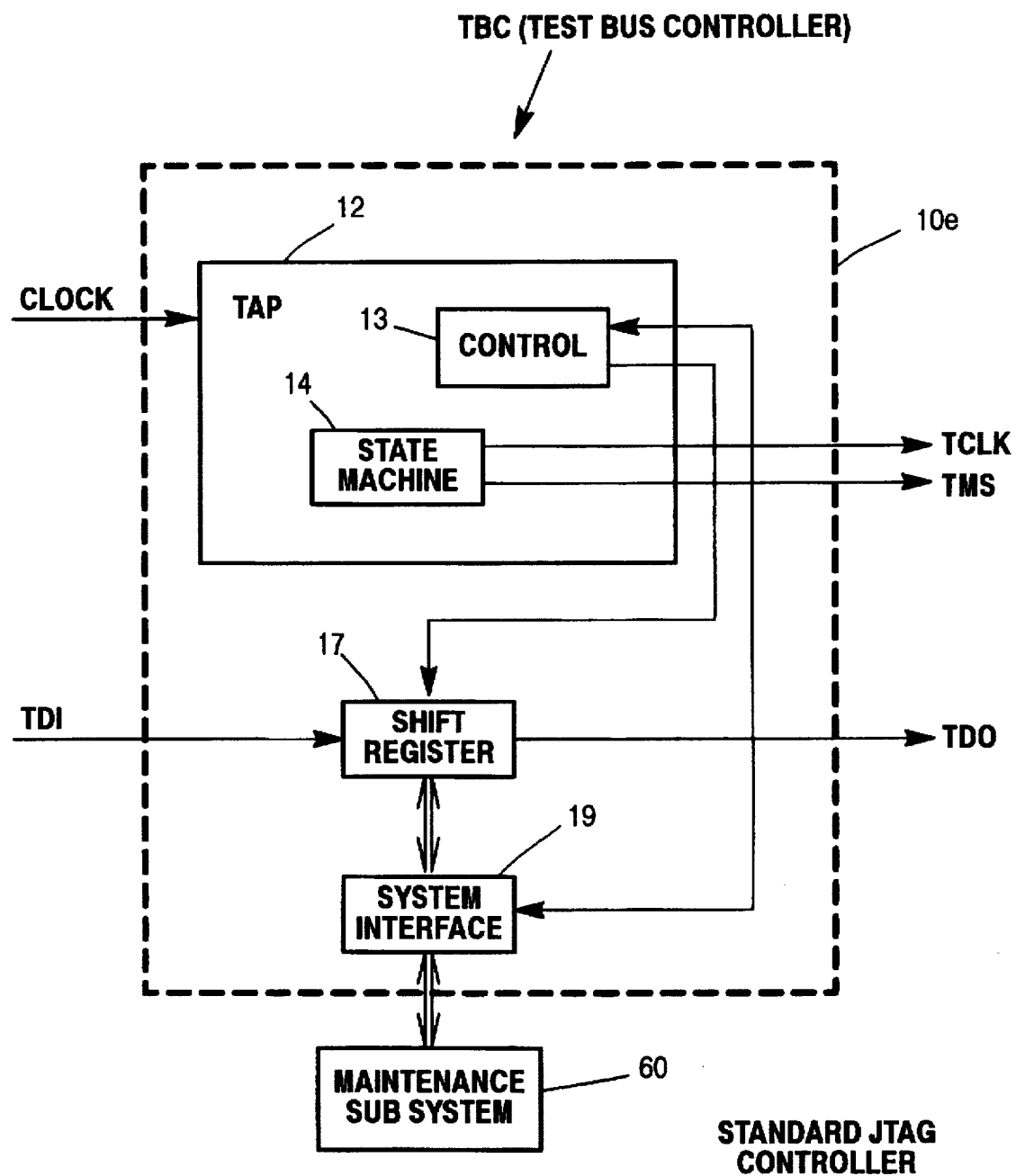
FIG. 1B is a drawing showing the standard JTAG controller used for the diagnosis and test of compliant digital devices.

FIG. 1B is a diagram showing in more detail the standard JTAG controller or TBC (test bus controller) $10_e$. As seen in FIG. 1B, the TBC $10_e$ has a test access port 12 being fed from a clock signal. Interior to the test access port 12, there is provided a state machine 14 and a control module 13. The state machine provides separate outputs designated as TCLK and TMS which represent the test clock signal and the test mode select signals.

The control module 13 provides signals to the shift register 17 and to the system interface 19. The system interface 19 is made to communicate with the maintenance subsystem 60 which can initiate the test and diagnostic operations. The shift register 17 also provides for a test data input signal designated TDI and a test data output signal designated TDO.

Figure 1C:
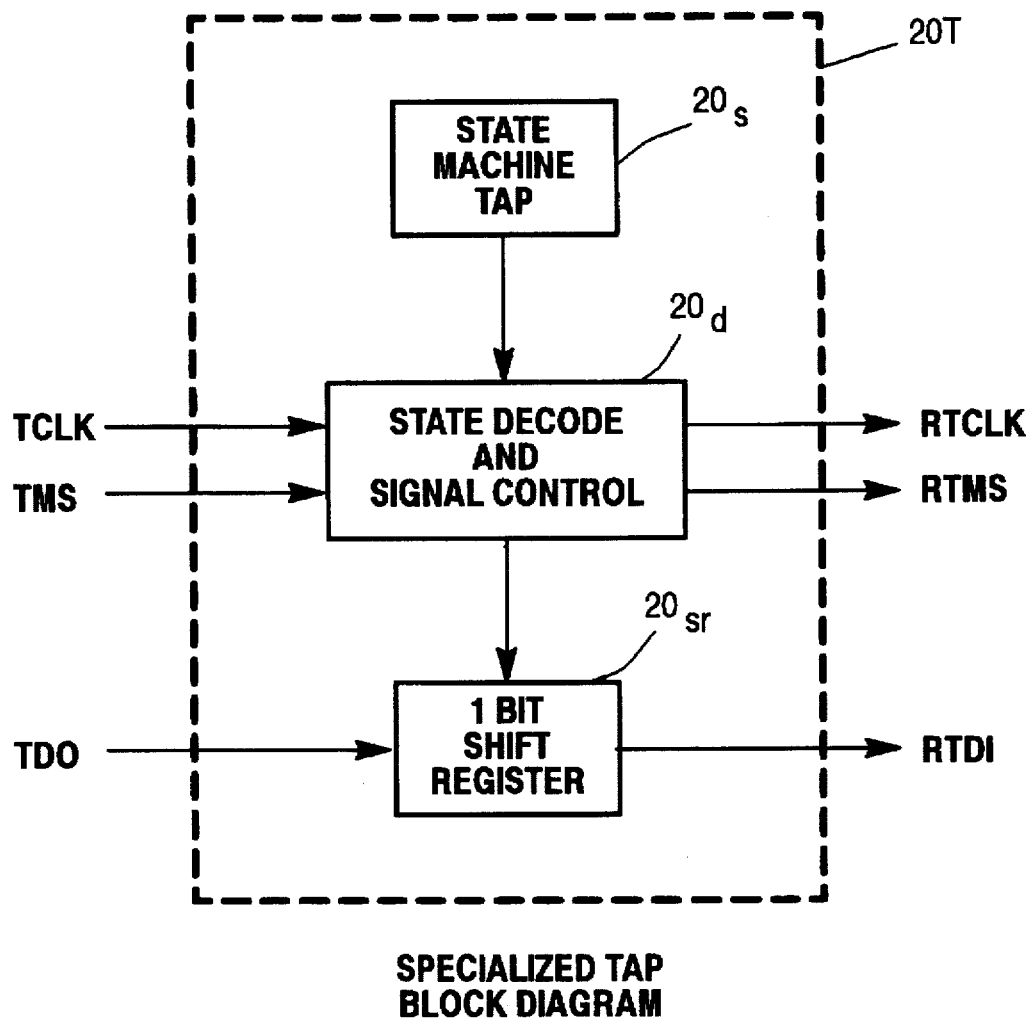
FIG. 1C is a diagram of the specialized test access port (STAP) which makes non-compliant devices compatible with the JTAG testing system.
Figure 1D:
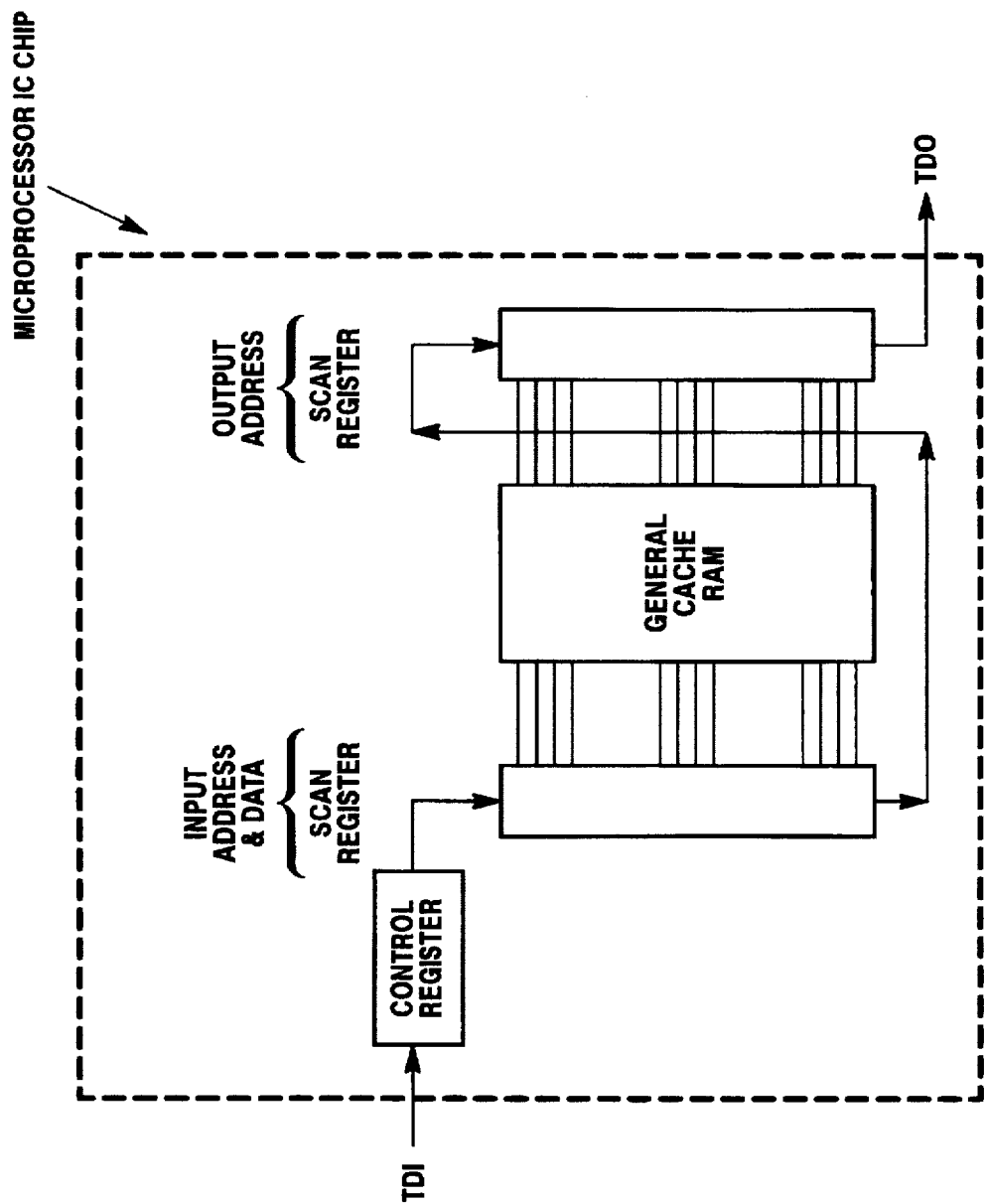
FIG. 1D is a schematic drawing showing one portion of the microprocessor (IC) chip holding a cache RAM supported by scan registers.

The specialized test access port 20T shown in FIG. 1A is shown in greater detail in FIG. 1C. Here, the specialized test access port 20T (STAP) can also be designated as the RASTAP which is a acronym for the RASCAL processor test access port where the RASCAL represents a specialized microprocessor design which is not compliant with the JTAG protocol. Referring to FIG. 1C, the specialized test access port 20T is seen to have a state machine $20_s$, a state decode and signal control module $20_d$ and 1-bit shift register $20_{sr}$. Inputs to the state decode and signal control module $20_d$ include the test clock signal TCLK and the test mode select signal TMS. These, respectively, now become specialized signals RTCLK and RTMS.

The 1-bit shift register $20_{sr}$ is seen to have input data provided by the test data output TDO line of the standard JTAG controller $10_e$, to provide a specialized output line designated as RTDI which is then passed as input on to the next device which as seen in FIG. 1A is a JTAG compliant device.

Figure 4:
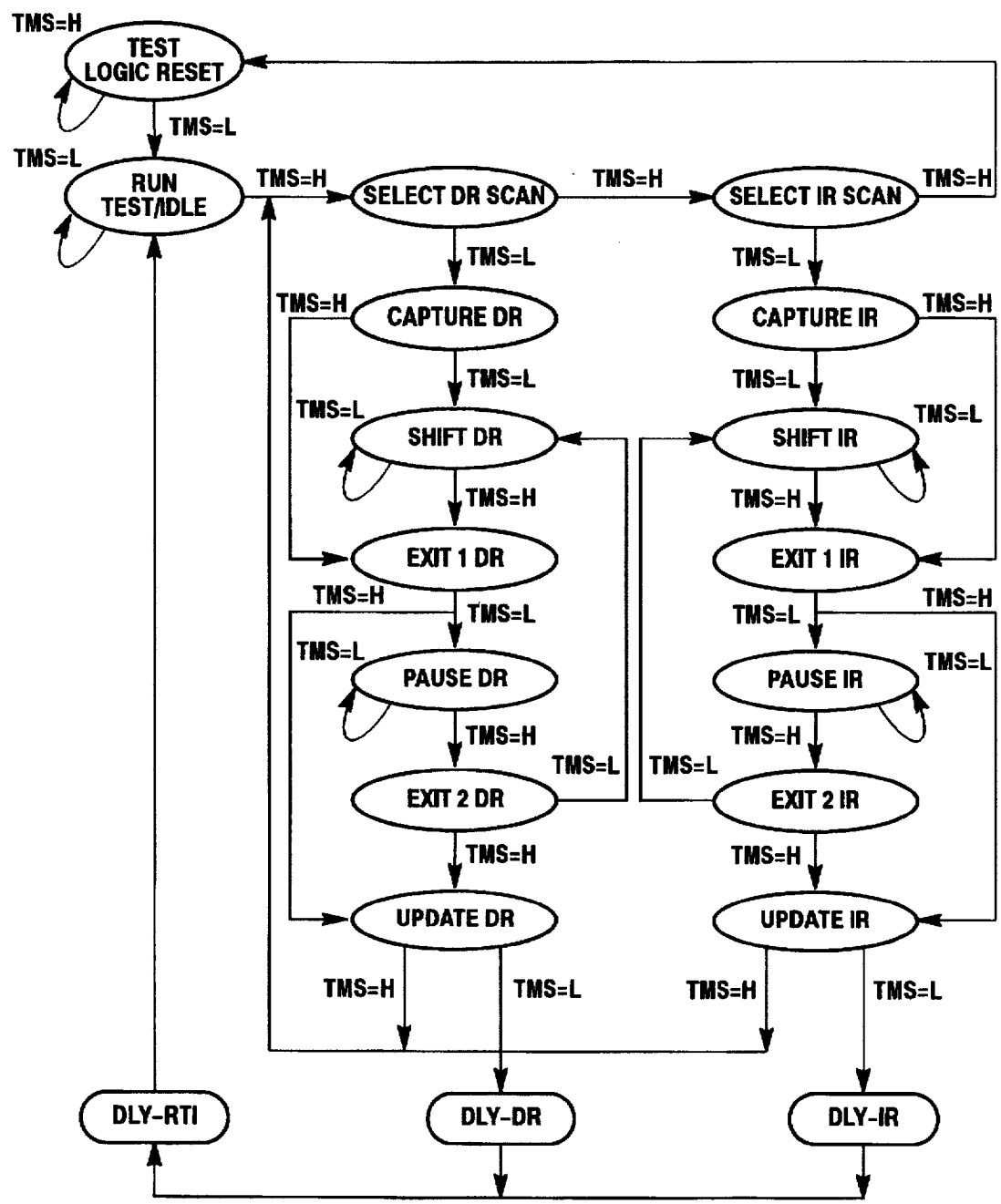
FIG. 4 is a newly developed programmatic state diagram which allows specialized control for the non-compliant Test Access Port logic.

The specialized Test Access Port 20T (RASTAP) uses a new format for the state conditions of the TAP state diagram shown in FIG. 4. As seen in FIG. 4, the logic of the specialized TAP, 20T, tracks the controller chip $10_e$ (TBC) through the various Test Access Port (TAP) state conditions. When the controller block $10_e$ and its Test Access Port is entering the Run-Test/Idle state, the specialized TAP 20T will issue the Test Clock (TCLK) which will place all of the device Test Access Ports into the state of Run-Test/Idle. The specialized Test Access Port 20T (STAP) will stop the Test Clocks (TCLKS) from being sent to the non-compliant circuitry devices $40_n$ until the Test Block Controller $10_e$ leaves the Run-Test/Idle state. The Test Block Controller TBC $10_e$ causes this transition by seeing that the Test Mode Select signal, TMS, is set to be at "logic 1".

Figure 5:
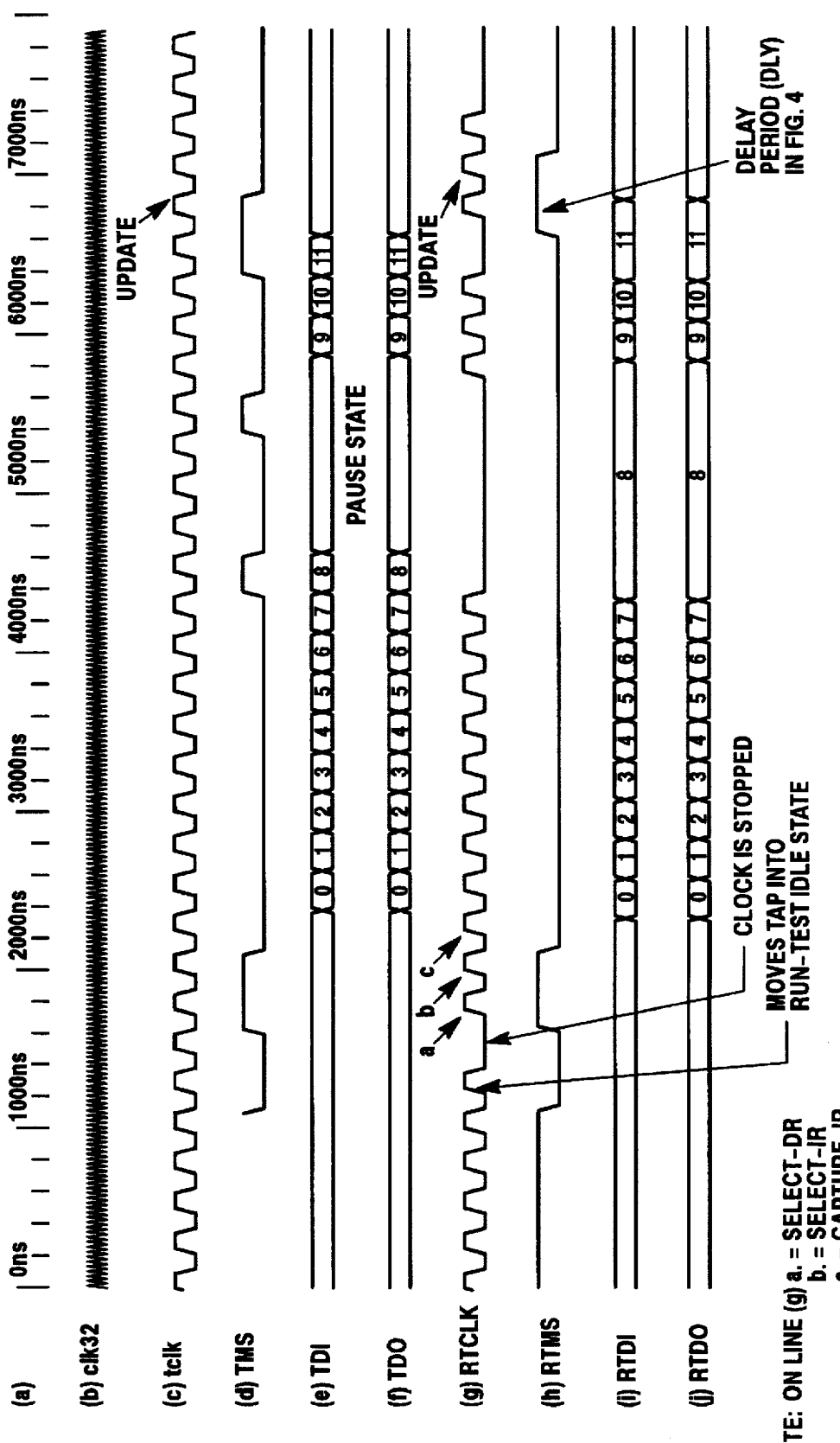
FIG. 5 shows a timing diagram indicating the effect on the TCLK signal to a non-compliant device while the TAP is in the state of "Run-Test/Idle"

As seen in FIG. 5 of the timing diagram, there is shown the effect on the Test Clock TCLK to the non-compliant circuitry device (RTCLK) while the Test Block Controller TBC $10_e$ is in the Run-Test/Idle state.

In FIG. 5 at line (a) there is shown the time periods involved in terms of nanoseconds. Line (b) shows the standard clock signal of 32 MHz. Line (c) is the Test Clock signal which is at 8 MHz.

Line (d) is the Test Mode Select signal which operates after 1100 nanoseconds. Line (e) indicates the test data coming into TBC $10_e$ from the last device on the serial data chain. Line (f) is the Test Data Input line which shows data bits 0–8 and later data bits 9–11 being transferred from the TBC $10_e$ to the STAP 20T. The time between transfers is due to TBC $10_e$ entering the PAUSE state.

Line (i) shows the Test Data Output line likewise with data bits 0–11 being transferred from the STAP, 20T to the microprocessor (non-compliant device).

Line (g) is the clock in the "non-compliant device" $40_n$ which is designated as RTCLK. Here it will be seen that this clock is stopped during the period from 1400 to 1800 nanoseconds.

Line (h) designated as the RTMS is the Test Mode Select signal which operates at 1200 nanoseconds and moves the Test Access Port into the Run-Test/Idle state.

Line (i) is the non-compliant Test Data Input, RTDI, which designates the Test Data Input into the non-compliant device $40_n$.

Line (j) is the Test Data Output line designated RTDO which represents the snake line of data output from the non-compliant device $40_n$.

The second function of the STAP, Specialized Test Access Port, 20T, is to keep the Non-Compliant Device $40_n$ (NCD) from entering either one of the "Pause" states. FIGS. 5 through 8 indicate the waveforms which are generated by the specialized Test Access Port 20T.

FIG. 5 shows a path which selects the Instruction Register (IR) of the specialized TAP device 20T and begins shifting without further delay. This is seen by following the level of the TMS signal on the rising edge of TCLK via FIG. 3.

Figure 6:
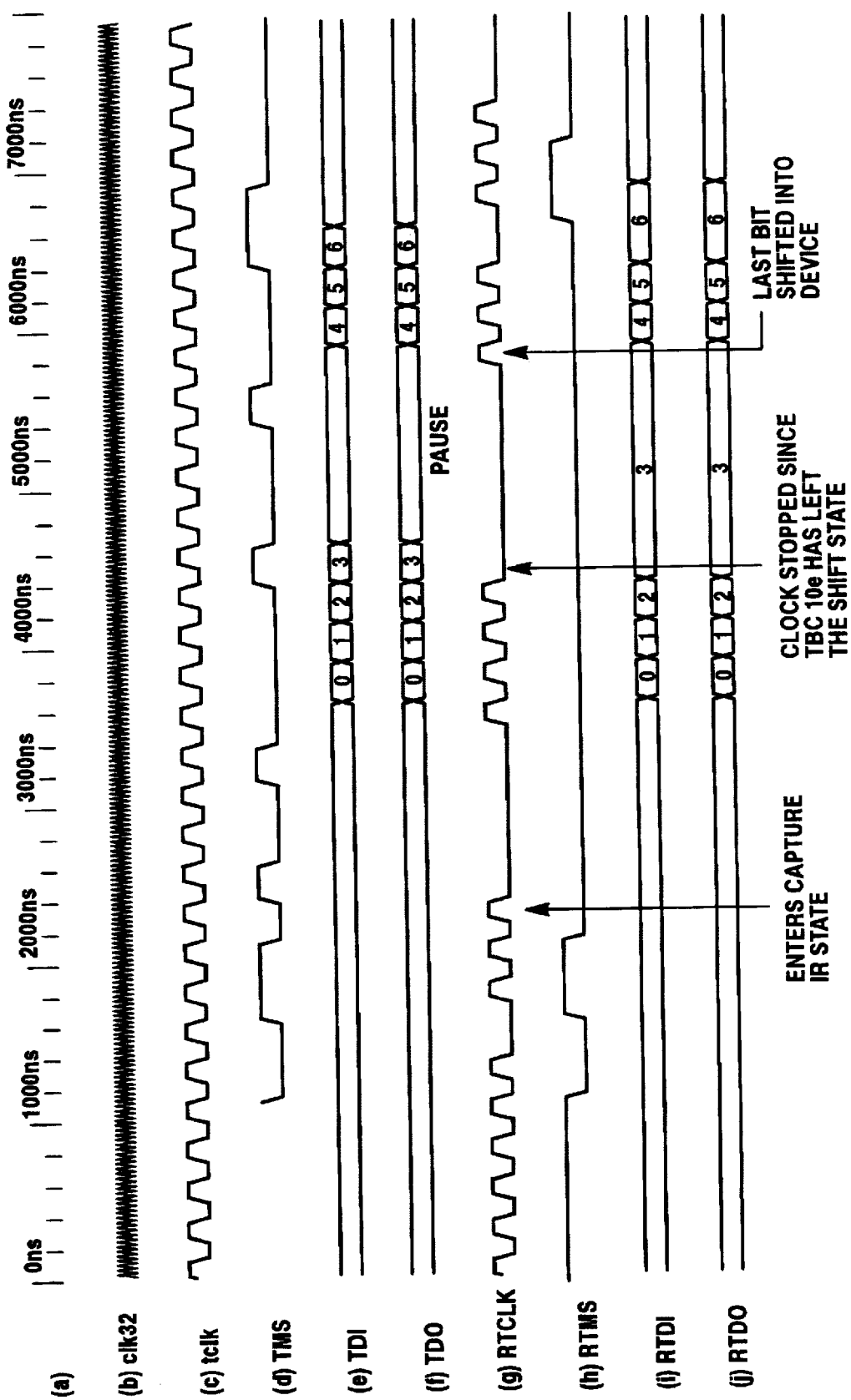

FIG. 6 shows the Instruction Register, IR, shift which first transitions into the Pause-IR state before data is actually shifted into the Instruction Register. As seen in FIG. 6, line (g), the non-compliant Test Clock signal enters the "Capture-IR" state at 2400 nanoseconds. Then the RTCLK clock signal on line (g) is stopped at 4400 nanoseconds because the controller block $10_e$ has left and finished the shift state.

Then on line (g), it is seen that the non-compliant Test Clock signal RTCLK will shift the last bit into the Non-Compliant Device at 5800 nanoseconds.

Figure 7:
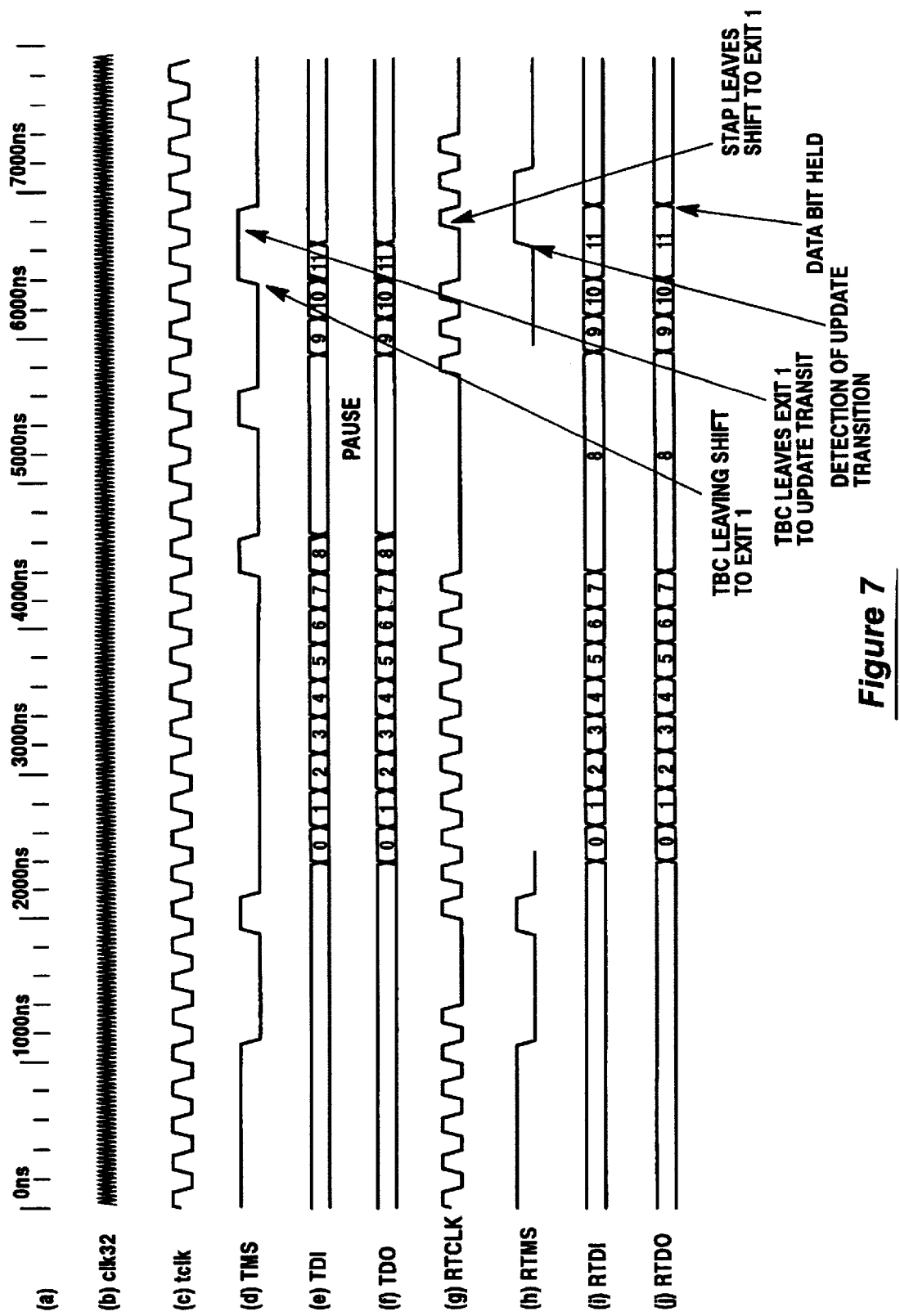
Figure 8:
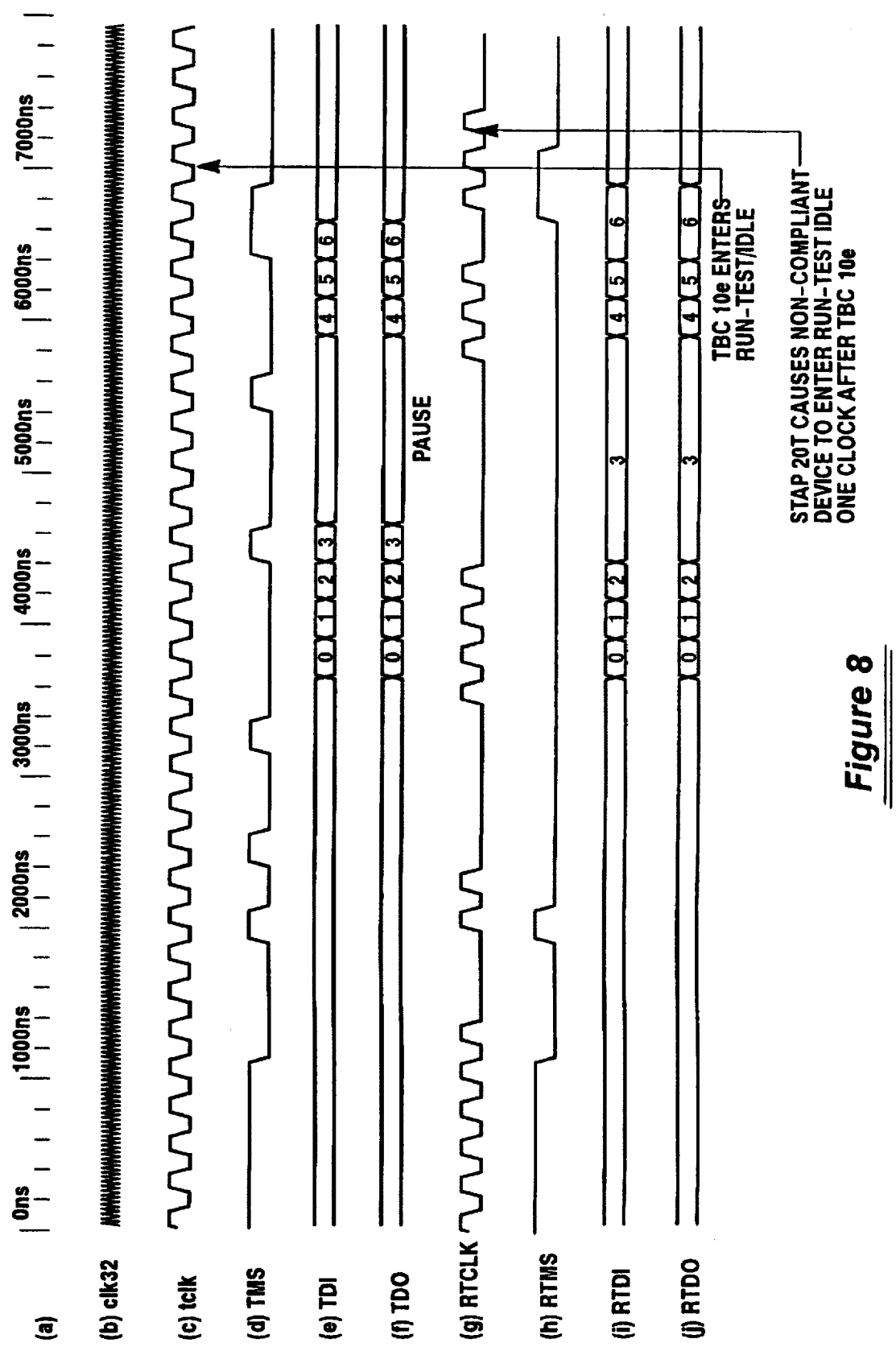

FIGS. 7 and 8 show how the (DR) data register shifting results under the same situation as the Instruction Register waveforms. These waveforms are useful in illustrating the complete design features.

Now referring to FIGS. 5, 6, 7 and 8, when the TAP controller block state machine, TBC, $10_e$ selects DR-Scan or IR-Scan, FIG. 4, one possible flow is to immediately begin shifting data in FIGS. 5 and 7 as shown in line (f), - - - or to enter Pause and to shift data on a later basis as seen in FIGS. 6 and 8 on line (f).

FIG. 6 indicates the points where the specialized TAP 20T (STAP) will stop the signal RTCLK on line (g) from being issued to the Non-Compliant Device $40_n$.

When the state machine controller block TBC $10_e$, enters the Capture state (FIG. 4), the controller $10_e$ proceeds to the Exit 1 state in order to enter the Pause state (FIG. 4). It will be noticed that the RTCLK on line (g) has been stopped by the specialized Test Access Port 20T at 4400 nanoseconds in FIG. 6. This keeps the Non-Compliant Device via the specialized TAP, 20T, in the "Capture" state (FIG. 4). When the state machine test block controller $10_e$ enters the Shift state, the specialized Test Access Port 20T then issues clocks RTCLKs over to the Non-Compliant Device $40_n$ and then data is shifted into the Non-Compliant Device $40_n$.

When the specialized Test Access Port 20T leaves the "Shift" state, then the specialized Test Access Port 20T stops the clock RTCLK as seen at 4400 nanoseconds, (FIG. 6) thus keeping the Non-Compliant Device Test Access Port in the "Shift" state. The last data bit is held in the STAP Device 20T for shifting into the Non-Compliant Device later on.

When the state machine controller block TBC $10_e$ enters the "Shift" state again, the "held data bit" is shifted into the Non-Compliant Device $40_n$ and then normal shifting continues. This sequence can continue until the state machine controller block TBC $10_e$ is ready for the last shift of data.

As previously occurred, the test bus controller, TBC (Standard JTAG Controller) $10_e$ will leave the Shift state and then enter the Exit 1 state and the Specialized Test Access Port, 20T, will stop the clock RTCLK. This time, the state machine test block controller $10_e$ will enter the "Update" state. When the specialized Test Access Port 20T detects that the TBC $10_e$ is going to enter the update state, it then raises the RTMS signal to a "logic 1" and issues a series of two clocks (RTCLKs), and then lowers the RTMS signal to a "Logic 0," then issues one clock, RTCLK, causing the non-compliant device to enter "Run-Test-Idle" state.

The specialized Test Access Port 20T holds the last data bit to be shifted into the Non-Compliant Device 40ₙ on the TAP transition over to Exit 1 (seen in FIG. 7). The test block controller state machine 10ₑ and the Non-Compliant Device Test Access Port in 20T will end in the Run-Test/Idle state as seen in FIG. 7.

The "delay" in detecting the completion causes the Non-Compliant Device Test Access Port 20T to be "one state behind" the TBC Test Access Port TAP (20T). This limitation requires the TBC TAP 10ₑ to enter the Run-Test/Idle for at least two clocks before another TAP transition can occur per FIG. 8 and the two "delay states" in FIG. 4. This particular limitation is within the Industrial Standard Control parameters. The test block controller 10ₑ (state machine) is controlled by software which defines the end state after the Instruction Register IR or the Data Register DR has been shifted. By setting the end state as Run-Test/Idle, the test block controller state machine 10ₑ TAP will meet the requirements of the STAP hardware design.

By utilizing the present implementation of the specialized test access program, industry software is now able to control a non-compliant circuitry device without any further modification. Thus, by using industry standard software on the card and with the use of factory test equipment, this reduced the effort required to support the manufacturing and engineering overhead of the test development.

The present system is capable of other variations of implementation and is defined by the following claims.

What is claimed is:

1. A control system for non-compliant JTAG devices comprising:
   (a) a non-compliant JTAG device which is normally incapable of following the standard JTAG protocol states during the Test Mode Select sequence of states;
   (b) means to control the operation of said non-compliant device to operate compatibly with the JTAG protocol, said means including a specialized Test Access Port (TAP) controller.

2. The system of claim 1 wherein said non-compliant device includes:
   (a) an integrated circuit chip holding a microprocessor and cache unit;
   (b) means to circulate input test data through said microprocessor and cache unit for readout and diagnosis of said microprocessor and cache unit.

3. The system of claim 2 wherein said non-compliant device includes:
   (a) a plurality of scan registers for passing test data through each one of a plurality of logic elements;
   (b) means to select and read out said data from each one of said scan registers.

4. The system of claim 3 wherein said means to control includes:
   (i) means to generate a specialized Test Mode Select Signal to disable entry of the JTAG "pause" state in said non-compliant device.

5. The system of claim 4 wherein said means to control includes:

(ii) means to generate a specialized Test Clock Signal to limit the specialized TAP controller to one clock period when it enters the Run-Test/Idle state.

6. On an integrated circuit having some logic elements capable and some logic elements not capable of test operations compatible with JTAG protocol, a system for boundary scan testing said integrated circuit without altering said JTAG protocol and without altering said non-compatible logic elements, said system comprising:
   (a) standard JTAG controller means for transmitting test data input signals to said devices compatible with JTAG protocol;
   (b) a specialized Test Access Port initiated by said standard JTAG Controller, for developing specialized control signal states to said non-compatible logic elements including:
      (b1) means to pass test data through said non-compatible logic elements for later transmission through compatible logic elements without compromising said JTAG protocol.

7. In a network of digital modules having JTAG protocol compliant devices and non-compliant JTAG protocol devices, all subject to testing using the JTAG protocol, a system for enabling JTAG testing of both compliant and non-compliant devices without alteration of the non-compliant devices nor alteration of the JTAG protocol, said system comprising:
   (a) maintenance subsystem means for initiating testing of multiple devices connected to a standard JTAG controller said multiple devices including non-compliant JTAG protocol devices;
   (b) said standard JTAG controller generating a Test Clock (TCLK) signal and Test Mode Select (TMS) signal to each one of said compliant devices and to a specialized (STAP Test Access Port controller, said JTAG controller including:
      (b1) means to transmit a series of test data bits for passage through each one of said multiple devices.
      (b2) means to receive back said series of test data bits after passage through each of said multiple devices;
   (c) said specialized Test Access Port Controller (STAP) connected to each one of said non-compliant JTAG devices, each said specialized TAP controller connected to receive said Test Clock (TCLK) and Test Mode Select (TMS) signals from said standard JTAG Controller and including:
      (c1) means to generate a specialized Test Mode Select (RTMS) signal to said non-compliant JTAG device to disable entry of the JTAG "Pause" state in said non-compliant device;
      (c2) means to generate a specialized Test Clock (TCLK) signal to limit the specialized TAP controller to one clock period when it enters the Run Test/Idle state and to stop the entry of the Pause state.

8. A method for rendering a non-compliant JTAG protocol device compatible with the JTAG testing protocol comprising the steps of:
   (a) controlling the state condition of said non-compatible device by limiting the Run Test/Idle state to one clock period;
   (b) stopping the non-compatible device from entering the Pause state.

* * * * *